United States Patent [19]

Mroch et al.

[11] Patent Number: 4,595,886
[45] Date of Patent: Jun. 17, 1986

[54] AC LOOP GAIN AND DC PREPOSITIONING ADJUSTMENT FOR PHASE LOCKED LOOP

[75] Inventors: Alan B. Mroch; Larry L. Westergren, both of Marion, Iowa

[73] Assignee: Rockwell International Corporation, El Segundo, Calif.

[21] Appl. No.: 663,009

[22] Filed: Oct. 19, 1984

[51] Int. Cl.⁴ .............................................. H03L 7/08
[52] U.S. Cl. .................................... 331/1 A; 331/17; 331/25
[58] Field of Search .......................... 331/1 A, 17, 25

[56] References Cited

U.S. PATENT DOCUMENTS

| | | | |
|---|---|---|---|
| 3,582,810 | 6/1971 | Gillette | 331/14 |
| 4,117,419 | 9/1978 | Rudd | 331/1 A |
| 4,118,674 | 10/1978 | Ball | 331/17 |
| 4,400,667 | 8/1983 | Belkin | 331/1 A |
| 4,404,530 | 9/1983 | Stryer | 331/1 A |
| 4,494,080 | 1/1985 | Call | 331/17 X |
| 4,511,858 | 4/1985 | Charavit et al. | 331/17 X |

Primary Examiner—Siegfried H. Grimm
Attorney, Agent, or Firm—George A. Montanye; H. Fredrick Hamann

[57] ABSTRACT

There is disclosed a circuit and technique for adjusting the AC loop gain and DC prepositioning in a phase locked loop. The system includes an in-phase and out-of-phase signal applied through exclusive-OR gate circuitry which includes inputs from a PROM to digitally adjust the AC gain in the phase locked loop. The PROM also stores digital values representing a desired DC prepositioning level which is coupled to the loop and converted to provide a signal summed with the AC signal to adjust the prepositioning level.

8 Claims, 1 Drawing Figure

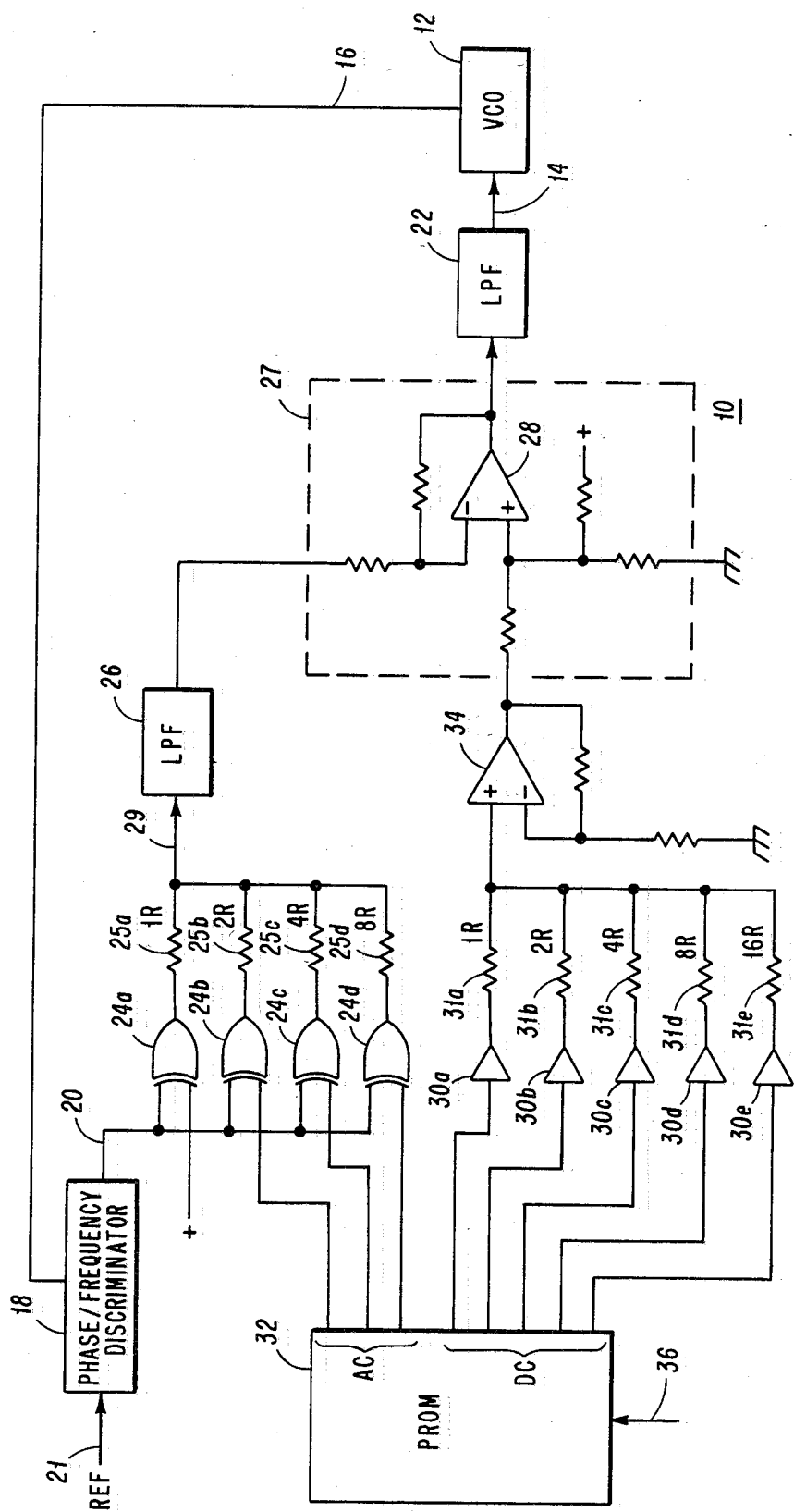

AC LOOP GAIN AND DC PREPOSITIONING ADJUSTMENT FOR PHASE LOCKED LOOP

BACKGROUND OF THE INVENTION

The present invention relates to phase locked loops and, more particularly, to systems and techniques for controlling the AC loop gain and DC prepositioning of such loops.

Phase locked loops and circuits for implementing such loops are well known in the prior art for providing frequency selective outputs which are easily controlled, adjustable, and stable in operation. In particular, a phase locked loop generally includes a voltage controlled oscillator having an output frequency which is dependent upon the voltage applied to a control input to the VCO. The output of the voltage controlled oscillator is coupled to provide a selected frequency as a desired output and is also provided as feedback to one input of a conventional phase/frequency discriminator. The phase/frequency discriminator has a second input which receives a reference frequency and provides an output which is coupled to provide a DC control signal to the control input of the voltage controlled oscillator.

In the above construction, the feedback of the output of the voltage controlled oscillator is compared in the phase/frequency discriminator with the input (reference) and that output signal used to control the VCO such that the output frequency of the VCO is locked to the reference frequency. In this manner, the phase locked loop can be constructed to provide an output frequency which tracks the input signal with a high degree of accuracy.

In accordance with prior art techniques, there have been proposed various methods for affecting the AC gain of the phase locked loop. There have also been proposed techniques for providing DC prepositioning in such phase locked loops. With the advent of digital systems, there has been a demand for improved frequency control using such phase locked loops and in particular, less complex, easily implemented and easily controlled digital phase locked loops. Such systems are particularly important to improve accuracy and allow easy and fast loop tuning and control.

The present invention has therefore been developed to overcome the specific shortcomings of the above known and similar techniques and to provide an improved tunable phase locked loop.

SUMMARY OF THE INVENTION

In accordance with the present invention, a phase locked loop is constructed using a voltage controlled oscillator having a frequency output and a control input. The frequency output is coupled through an input of a phase/frequency discriminator having a reference frequency input to a second terminal. The output of the phase/frequency discriminator is coupled through a ladder network defined by a plurality of exclusive OR-gates and digitally controlled by a programmable-read-only memory in response to frequency control inputs to alter the AC gain. Additional digital data stored in the PROM is also coupled through a ladder network to define the DC prepositioning level by use of an output signal from the ladder network which is combined in a summing circuit with the AC gain control signal to produce the combined control signal output to the voltage controlled oscillator. By use of the programming of the PROM, the digital data stored in the PROM can be used to control the AC gain and the DC prepositioning level by selectively altering the ladder networks of each signal control.

It is therefore a feature of the invention to provide an improved and more versatile phase locked loop.

It is a further feature of the invention to provide a digitally adjustable phase locked loop.

Yet another feature of the invention is to provide a system and technique for controlling the AC loop gain and DC prepositioning level in a phase locked loop.

Still another feature of the invention is to provide digital PROM control of the AC gain and DC prepositioning level of a phase locked loop.

Yet still another feature of the invention is to provide digital AC ain control through a plurality of exclusive OR-gates having weighted outputs selected in accordance with digital PROM control.

These and other advantages and novel features of the invention will become apparent from the following detailed description when considered in connection with the accompanying drawings wherein:

BRIEF DESCRIPTION OF THE DRAWINGS

The FIGURE is a schematic diagram showing the AC gain and DC prepositioning control in accordance with the present invention.

DETAILED DESCRIPTION OF A PREFERRED EMBODIMENT

Referring now to the drawings, there is shown in the FIGURE, a schematic diagram representing the circuit implementation of AC gain control and DC prepositioning control in a phase locked loop. The system 10 of the present invention includes a conventional voltage controlled oscillator 12 having a control input terminal through line 14 and a frequency output on line 16. As is known, the voltage controlled oscillator produces an output frequency on line 16 which is related to the DC input level at its control terminal over line 14. In the particular embodiment, the voltage controlled oscillator may produce sine or squarewave outputs, or any other frequency output in accordance with techniques known in the prior art.

The frequency output on line 16 (which could include a conventional divider or translator for providing a divided or translated frequency) is coupled as one input to a conventional phase/frequency discriminator 18. The phase/frequency discriminator 18 includes a second input on line 21 which receives a reference frequency in a conventional fashion. The control signal output of the phase/frequency discriminator 18 is provided on line 20. In accordance with a conventional phase locked loop, the output from phase/frequency discriminator 18 as provided on line 20 would normally be provided through lowpass filter 22 to provide a DC output on line 14 for the control of the VCO 12. Thereafter, the feedback of the frequency output on line 16 to the phase/frequency discriminator 18 would cause the control signal on line 20 to drive the VCO 12 such that the frequency on line 16 tracks the reference frequency on line 21. By selectively altering the reference frequency on line 21 or the divided or translated frequency noted above), the frequency on line 16 can be selectively changed while still maintaining its tracking with the reference frequency on line 21. In this manner, a stable frequency output on line 16 can be obtained while still allowing frequency selectivity in accordance with the reference frequency on line 21 (or the noted division or translation).

In accordance with the present invention, the conventional loop is modified to provide digital control of the AC gain and the DC prepositioning of the loop. Specifically, the output on line 20 from the phase/frequency discriminator 18 is coupled as one input to a plurality of exclusive OR-gates 24a–24d. The outputs of the exclusive OR-gates are each connected to respective resistor 25a–25d forming a ladder entwork and having their outputs coupled in common to one another. The resistors 25a–25d are related to provide weighted outputs in accordance with a specific m relationship. In this instance, if the magnitude of the first resistance is 1R, each of the next succeeding resistances are double the preceding resistance (e.g., 1R, 2R, 4R, 8R). The output of the ladder network created by the exclvive-OR and associated resistors is coupled through line 29 as input to lowpass filter 26 which has its output coupled to one input of a summing circuit 27.

The signal inputs to the second inputs of each of the exclusive OR-gates 24a–24d is provided as shown in the drawing. In this instance, the second input to 24a is coupled to a bias voltage representing a digital logic level (logic "1") while the second inputs to exclusive OR-gates 24b–24d are coupled to receive digital logic signals from the AC control signal outputs of a programmable-read-only memory 32. The digital signals from 32 representing the inputs to the exclusive OR-gates 24b–24d thus provide the AC control allowing a variable selection and tuning of the AC gain using in-phase and out-of-phase signals through the exclusive OR-gates and weighted resistors.

The PROM is likewise constructed to provide a plurality of DC control signal outputs which are coupled to provide the DC prepositioning control through conventional signal drivers 30a–30e. Each of the signals from the PROM representing the digital DC control signals are coupled through their respective driver and an associated resistor 31a–31e. The output terminals of each of the resistors 31a–31e are in turn coupled in common and provided as a positive input to an amplifier 34. The amplifier 34 is in turn coupled as a second input to the summing circuit 27. As in the prior example with respect to the AC control signal, the resistor ladder network formed by the resistors 31a–31e provides weighted outputs of the DC control signals through resistors which have a mathematical relationship. In the present instance, each resistance has a value double that of the preceeding resistance (e.g., 1R, 2R, 4R, 8R, 16R). This provides a selected weighted output current which is amplified by amplifier 34 prior to summation with the AC signal from lowpass filter 26.

The summing circuit 27 may be a conventional summing amplifier including an operational amplifier 28 having an inverting and non-inverting terminal wherein the signal from lowpass filter 26 is coupled through a resistor to the inverting terminal and the DC signal from amplifier 34 is coupled through a resistor to the non-inverting terminal. The amplifier 28 has a feedback resistor for providing feedback to the inverting input in a conventional fashion and includes a bias network coupled to the non-inverting input in a conventional fashion. The operation of the circuit 27 is to provide a summation of the DC level and the AC signal to provide a combined output to the lowpass filter 22 which in turn is coupled to produce the DC signal on line 14 for control of the VCO 12. In actual circuit implementation, it may be desirable to include a resistor between the output of circuit 27 and the input to LPF 22.

In operation, frequency control data may be entered at the PROM input ports generally designated at 36, which will allow the digital value at the PROM outputs to be controlled in any desired fashion. Accordingly, by selecting the digital outputs from the PROM, both the AC gain and DC prepositioning levels can be independently controlled. This allows independent DC prepositioning to be obtained as well as easily implemented and precise AC loop gain control for fast tuning. The binary weighted resistors which form the ladder networks involved in both control circuits enable the addition or subtraction of current. The contributions from both the AC and DC control are combined in the summing amplifier to produce the desired AC gain and DC prepositioning level.

As will be appreciated, the above technique allows a simple and independent modification of AC gain and DC prepositioning control. This can be accomplished and changed by input data provided to the programmable-read-only memory 32 in a quick and concise fashion to allow fast and accurate tuning and selection. The same may be implemented with conventional logic circuits which allow less expensive production and incorporation in electronic systems, particularly in digitally implemented systems. All of these are features which are unrecognized by any of the prior art.

Obviously, many other modifications and variations are possible in light of the above teachings. It is therefore to be understood that within the scope of the appended claims, the invention may be practiced otherwise than as specifically described.

What is claimed is:

1. A system for digitally controlling the AC gain and DC prepositioning level of a phase locked loop comprising:

a voltage controlled oscillator having a control terminal and a variable frequency output;

a phase/frequency discriminator having a first input for receiving a reference frequency and a second input for receiving said variable frequency output and an output terminal for providing a control signal;

a programmable-read-only memory having an input for receiving digital control data, a first plurality of digital outputs for providing AC gain control signals, and a second plurality of digital outputs for providing DC control signals;

AC gain control means including a plurality of exclusive OR-gates each having first and second input terminals and an output terminal, the first input terminal of each of said exclusive OR-gates being coupled to receive said control signal and the second input terminal of each of said exclusive OR-gates being coupled to receive a different one of said first plurality of digital outputs, a plurality of first resistors each having first and second terminals, the first terminal of each resistor being coupled to a different one of the output terminals of said plurality of exclusive OR-gates and the second terminal of each resistor being coupled in common, a first lowpass filter having an input terminal and an output terminal, said input terminal of said first lowpass filter being coupled to the common coupling of said first resistors;

DC prepositioning control means including a plurality of drivers each having an input terminal and output terminal, each of said input terminals of said plurality of drivers being coupled to a different one of said second plurality of digital outputs, a plurality of second resistors each having a first terminal and a second terminal, said first terminal of each of said plurality of second resistors being coupled to a different one of said output terminals of said plurality of drivers and said second terminal of each of said plurality of second resistors being coupled in common, and an amplifier having an input coupled to the common coupling of said plurality of second resistors and an output;

means for summing the output of said first lowpass filter and the output of said amplifier to provide a summed output; and second lowpass filter means having an input coupled to receive said summed output and an output coupled to the control terminal of said voltage controlled oscillator.

2. A phase locked loop comprising:

means having a control terminal input and responsive to a signal at the control terminal input for providing a variable frequency output which varies in frequency in response to changes in said control signal;

means for providing a reference frequency output;

discriminating means responsive to said variable frequency output and said reference frequency output for detecting differences between said reference frequency output and said variable frequency output to provide a discriminating signal;

AC control means having an input and output and means for varying the gain between its input and output, said input of said AC control means being coupled to the output of said discriminating means and said means for varying the gain including a plurality of exclusive OR-gate resistor pairs constructed and arranged to form a ladder network between the input and output of said AC control means;

DC control means having an input and output and means for providing a variable DC signal between its input and output to produce a DC prepositioning signal at the output of said DC control means, said means for producing a variable DC prepositioning signal including a plurality of resistors constructed and arranged to form a ladder network; and means for combining the signals at the output of said AC control means and said DC control means for producing a combined signal output, said combined signal output being coupled to said control terminal input to form a phase locked loop.

3. The system of claim 2 further comprising a PROM having first outputs coupled to said exclusive OR-gates to allow variation in the gain through said ladder network of the AC control means and second outputs coupled to the resistors of said DC control means to allow variation in the DC prepositioning signal.

4. In a phase locked loop including a voltage controlled oscillator having a control input and a variable frequency output, a phase/frequency discriminator having a first input coupled to receive a reference frequency and a second input coupled to receive said variable frequency output and an output coupled to provide a signal to the control input of said voltage controlled oscillator to produce phase locking, the improvement in said phase locked loop comprising:

AC gain control means coupled to the output of said phase/frequency discriminator for receiving a signal from the output of said phase/frequency discriminator and applying a variable gain to produce a variable gain signal output, said AC gain control means including a plurality of exclusive OR-gates each having a first input coupled to receive the signal from the output of said phase/frequency discriminator and an output coupled to a first terminal of each of a plurality of first resistors having second terminals coupled to common, and a PROM having a plurality of first outputs wherein each of said plurality of first outputs are coupled to a second terminal of a different one of said exclusive OR-gates;

DC control means for providing a variable DC signal as a prepositioning signal output; and means for combining said variable gain signal output and said prepositioning signal output to provide a signal to the control input of said voltage controlled oscillator to produce said phase locking.

5. The system of claim 4 wherein said DC control means includes a plurality of drivers, each having an input and an output, each of said outputs of said drivers being coupled to a first terminal of a different one of a plurality of second resistors having second terminals coupled in common, said PROM having a plurality of second outputs, each of said second outputs being coupled to a different one of said inputs to said drivers.

6. The system of claim 5 wherein said common coupling of said first resistors is coupled through a first lowpass filter and said common coupling of said second resistors is coupled through an amplifier and further wherein said means for combining includes a means for summing outputs of said first lowpass filter and said amplifier to provide the signal to said control input of said voltage controlled oscillator.

7. The system of claim 1 further including a second lowpass filter coupled between said means for summing and said control input.

8. The system of claim 5 wherein each of the resistors of said AC gain control means and said DC control means is double the value of the next adjacent preceeding resistor of said plurality of resistors.

* * * * *